United States Patent [19]

Lewis

[11] 4,448,875
[45] May 15, 1984

[54] ELECTRON BEAM SENSITIVE MIXTURE RESIST

[75] Inventor: David F. Lewis, Monroe, Conn.

[73] Assignee: GAF Corporation, New York, N.Y.

[21] Appl. No.: 480,636

[22] Filed: Mar. 31, 1983

[51] Int. Cl.$^3$ ............................................. G03C 5/16
[52] U.S. Cl. ................................ 430/283; 430/287; 430/270; 430/942; 204/159.15; 525/256; 525/259
[58] Field of Search ............... 204/159.15; 525/256, 525/259, 285; 430/296, 942, 908, 905, 287, 270, 283

[56] References Cited

U.S. PATENT DOCUMENTS

| | | | |
|---|---|---|---|
| 3,703,402 | 11/1972 | Cole | 204/159.15 X |
| 3,931,435 | 1/1976 | Gipstein et al. | 430/270 X |
| 4,061,832 | 12/1977 | Roberts | 204/159.22 X |
| 4,375,398 | 3/1983 | Lorenz et al. | 430/296 X |

OTHER PUBLICATIONS

Herbert Cole et al., "Electron Sensitive Resists Derived from Vinylether–Maleic Anhydride Copolymers", *IEEE Transactions on Electron Devices*, vol. ED-22, No. 7, 1975, pp. 417–420.

*Primary Examiner*—John E. Kittle
*Assistant Examiner*—Cynthia Hamilton
*Attorney, Agent, or Firm*—J. G. Mohr; J. J. Ward

[57] ABSTRACT

This invention describes an ionizing radiation sensitive material having high contrast, high sensitivity and comprised of the mixture of the half-ester or half amide product of reaction of an N-hydroxy or N-aminoalkyl amide with an alkylvinyl ether-maleic anhydride copolymer and the products of reaction of a hydroxy alkyl terminally unsaturated compound with an alkylvinyl ether-maleic anhydride copolymer. A typical material is made by mixing the product of reaction of hydroxyethyl pyrrolidone and octadecylvinyl ether—maleic anhydride copolymer with the products of reaction of the mixture of hydroxyethyl acrylate with octadecylvinyl ether-maleic anhydride copolymer.

26 Claims, No Drawings

ELECTRON BEAM SENSITIVE MIXTURE RESIST

BACKGROUND OF THE INVENTION

1. Field of the Invention

This invention relates to ionizing radiation sensitive materials which are useful as electron beam resists and information recording media.

2. Description of the Prior Art

Unsaturated ester derivatives of a 1:1 copolymer of octadecyl vinyl ether-maleic anhydride exhibit electron sensitivity of about $10^{-7}$ to about $5 \times 10^{-7}$ coulomb/cm$^2$, but since the contrast of these materials is generally less than about 1.2 they do not have the ability to record submicron images. When exposed to electrons with energies below about 30 keV, other derivatives, namely the hydroxyethylpyrrolidone (HEP) esters of the same copolymer, have a sensitivity of only about $10^{-4}$ coulomb/cm$^2$ to electron radiation.

The literature indicates that a mixture of electron sensitive polymers with widely differing sensitivities would be expected to have sensitivity intermediate between the values of the components of the mixture and to exhibit a greatly inferior contrast—and hence resolving power—to either of the constituents. I find that this is not the case with mixtures of the aforementioned hydroxyethyl pyrrolidone derivative with the mixtures of the products of reaction of the unsaturated ester derivatives. Even more significantly, it has been found that the contrast of such resists improves appreciably, which feature provides a resolution capability of less than 0.5 micrometer. This increased contrast is achieved herein with resists made by mixing the products of reaction of an alkylvinyl ether-maleic anhydride copolymer with a hydroxyalkyl acrylate such as hydroxyethyl acrylate, hydroxyethyl methacrylate, 3-hydroxypropyl acrylate, 3-hydroxypropylmethacrylate, 4-hydroxybutyl acrylate, 4-hydroxybutyl methacrylate or allyl or propargyl alcohol or pentaerythritol triacrylate and the products of reaction of an N-hydroxyalkyl amide or an N-aminoalkyl amide and an alkylvinyl ether-maleic copolymer anhydride to form the novel half-ester copolymer.

SUMMARY OF THE INVENTION

The present invention describes an ionizing radiation sensitive material having high contrast, high sensitivity and comprised of the mixture of the half-ester or half amide product of reaction of an N-hydroxy or N-aminoalkyl amide with an alkylvinyl ether-maleic anhydride copolymer and the products of reaction of a hydroxy alkyl terminally unsaturated compound with an alkylvinyl ether-maleic anhydride copolymer. A typical material is made by mixing the product of reaction of hydroxyethyl pyrrolidone and octadecylvinyl ether-maleic anhydride copolymer with the products of reaction of the mixture of hydroxyethyl acrylate with octadecylvinyl ether-maleic anhydride copolymer. In the preferred form of the invention, an N-hydroxyalkyl cyclic amide, such as hydroxyethyl pyrrolidone, and a hydroxyalkyl acrylate, such as hydroxyethyl acrylate, are each separately reacted with a long chain alkylvinyl ether-maleic anhydride copolymer, preferably having about 10-20 carbon atoms in the alkyl chain, such as octadecylvinyl ether-maleic anhydride copolymer and then mixed together. The products of reaction of the hydroxyethyl pyrrolidone mixture and hydroxyethyl acrylate mixture are preferably mixed in a 40:60 molar ratio. The product which is soluble in common solvents such as toluene readily forms smooth films on a substrate.

Upon irradiation with an electron beam, the resists of the invention crosslink at a low electron density to form an insoluble polymer (a negative resist) which is adherent to the substrate, is non-tacky and easily handled. The unexposed resist can be washed off readily to form the desired resist pattern.

DETAILED DESCRIPTION OF THE INVENTION

The electron beam sensitive materials of the invention are characterized by the following: (1) high sensitivity to electron beam irradiation; (2) insensitivity to visible light or near ultraviolet irradiation; (3) ease of forming smooth films on substrates; (4) resistance of the crosslinked polymer to wet or dry etch; (5) an ability of the material to be washed away readily in the unexposed areas with conventional solvents; (6) formation of a negative resist pattern; (7) superb contrast and resolution capabilities; (8) thermal stability; (9) good shelf life; (10) minimal dark reaction after exposure.

These advantageous properties of the materials of the invention are achieved herein unexpectedly as they contain a lesser amount, approximately 26%, of terminal unsaturation in the ester groups as compared to resists shown in the prior art and their sensitivity is much greater than the average sensitivity between the two. The mechanism by which the resists of the invention provide these advantageous properties and characteristics is unknown at present. However, it is believed that the amide and acrylate groups may form a charge transfer complex which lowers the energy required for the acrylate groups to crosslink with adjacent chains. This explanation is supported by the experimental evidence that increased sensitivity is achieved at a molar ratio of amide to acrylate which approaches 1:1, which would be the optimum ratio for formation of such a charge transfer complex.

One embodiment of the material of the invention is prepared by mixing the products of the reaction of alkylvinyl ether-maleic anhydride copolymer mixed with N-hydroxyalkyl amide and the products of reaction of the mixture of the hydroxyalkyl acrylate compounds with alkylvinyl ether-maleic anhydride copolymer. Then a thin film of the polymer is applied to a suitable substrate, such as chrome plated glass or quartz mask substrate, silicon wafer or a conductive polyester substrate, and exposed at various charge densities.

The hydroxyalkyl amide component is either an N-hydroxyalkyl cyclic amide, such as hydroxyalkyl pyrrolidone, e.g. hydroxyethyl pyrrolidone, hydroxypropyl pyrrolidone, hydroxybutyl pyrrolidone, hydroxyethyl-α-caprolactam, hydroxypropyl-α-caprolactam, hydroxybutyl-α-caprolactam and the like; or an N-hydroxyalkyl linear amide, such as N-hydroxyethyl acetamide, N-hydroxyethyl propionamide, and the like.

The terminally unsaturated component includes such compounds as allyl or propargyl alcohol and hydroxyalkyl acrylate, e.g. hydroxyethyl acrylate, or methacrylate, 3-hydroxypropyl acrylate or methacrylate, 4-hydroxybutyl acrylate or methacrylate or pentaerythritol triacrylate and the like.

Another embodiment of the material of the invention is prepared by mixing the products of reaction of the alkylvinyl ether-maleic anhydride copolymer with a N-aminoalkyl amide and the products of reaction of the mixture of the hydroxy alkyl acrylate compounds with alkylvinyl ether-maleic anhydride copolymer to form the material. Then a thin film of the material is applied to a suitable substrate, such as chrome plated glass or quartz mask substrate, silicon wafer or a conductive polyester substrate, and exposed at various charge densities.

The aminoalkyl amide component is either an N-aminoalkyl cyclic amide, such as aminoalkyl pyrrolidone, e.g. aminoethyl pyrrolidone, aminopropyl pyrrolidone, aminobutyl pyrrolidone, aminoethyl-α-caprolactam, aminopropyl-α-caprolactam, aminobutyl-α-caprolactam and the like; or an N-aminoalkyl linear amide, such as N-aminoethyl acetamide, N-aminoethyl propionamide, and the like.

EXAMPLE 1

Preparation of a resist material is accomplished by combining the products of reaction of a mixture of 40 Mole Percent Hydroxyethyl Pyrrolidone with octadecylvinyl ether-maleic anhydride and the product of reaction of a mixture of 60 mole Percent Hydroxyethyl Acrylate with octadecylvinyl ether-maleic anhydride.

In this case in which the unsaturated ester derivative is hydroxyethylacrylate (HEA), the following data is obtained:

| Amount HEA Ester (%) | Amount HEP Ester (%) | Sensitivity $\times 10^6$ Coulomb/cm$^2$ | Contrast |
|---|---|---|---|
| 100 | — | 0.46 | 1.0 |
| 50 | 50 | 0.51 | 1.7 |
| 25 | 75 | 0.86 | 2.5 |
| — | 100 | 100 | — |

The increased contrast obtained with these mixtures permits the ability to resolve submicron structures. The accomplishment of the high contrast without drastic loss in sensitivity yields an electron recording medium useful in the art of submicron, electron beam lithography.

What is claimed is:

1. A high sensitivity electron beam resist material which is the mixture of the reaction product consisting essentially of a mixture of an alkyl vinyl ether-maleic anhydride copolymer with a terminally unsaturated alcohol and the reaction product consisting essentially of a compound selected from the group consisting of N-hydroxyalkyl amides and N-aminoalkyl amides mixed with alkylvinyl ether-maleic anhydride copolymer.

2. A high sensitivity electron beam resist material comprising the mixture of the reaction product consisting essentially of a mixture of an N-hydroxyalkyl amide with alkylvinyl ether-maleic anhydride copolymer and the reaction product consisting essentially of a mixture of a terminally unsaturated alcohol with an alkyl vinyl ether-maleic anhydride copolymer.

3. A resist material according to claim 2 in which said N-hydroxyalkyl amide is an N-hydroxyalkyl cyclic amide.

4. A resist material according to claim 3 in which said amide is a hydroxyalkyl pyrrolidone.

5. A resist material according to claim 3 in which said amide is a hydroxyalkyl-α-caprolactam.

6. A resist material according to claim 3 in which said amide is hydroxyethyl pyrrolidone, hydroxypropyl pyrrolidone, hydroxybutylpyrrolidone, hydroxyethyl-α-caprolactam, hydroxypropyl-α-caprolactam or hydroxybutyl-α-caprolactam.

7. A resist material according to claim 2 in which said N-hydroxyalkyl amide is an N-hydroxyalkyl linear amide.

8. A resist material according to claim 7 in which said amide is N-hydroxyethyl acetamide, or N-hydroxyethyl propionamide.

9. A resist material according to claim 2 in which said terminally unsaturated alcohol is hydroxyethyl acrylate, hydroxyethyl methacrylate, 3-hydroxypropyl acrylate, 3-hydroxypropylmethacrylate, 4-hydroxybutyl acrylate or 4-hydroxybutyl methacrylate.

10. A resist material according to claim 2 in which said hydroxyalkyl amide and terminally unsaturated alcohol reaction products are present in a molar ratio of about 40:60 to 60:40 to one another in said mixture.

11. A resist material according to claim 2 in which said hydroxyalkyl amide and terminally unsaturated alcohol reaction products are present in a molar ratio of about 10:90 to 90:10 to one another in said mixture.

12. A resist material according to claim 2 in which said hydroxyalkyl amide and terminally unsaturated alcohol reaction products are present in a molar ratio of about 50:50 to one another in said mixture.

13. A high sensitivity electron beam resist material comprising the mixture of the reaction product consisting essentially of a mixture of an N-aminoalkyl amide with an alkyl vinyl ether-maleic anhydride copolymer and the product of reaction consisting essentially of a mixture of a terminally unsaturated alcohol with an alkylvinyl ether-maleic anhydride copolymer.

14. A resist material according to claim 13 in which said N-aminoalkyl amide is an N-aminoalkyl cyclic amide.

15. A resist material according to claim 14 in which said amide is a aminoalkyl pryrolodone.

16. A resist material according to claim 14 in which said amide is a aminoalkyl-α-caprolactam.

17. A resist material according to claim 14 in which said amide is aminoethyl pyrrolidone, aminopropyl pyrrolidone, aminobutylpyrrolidone, aminoethyl-α-caprolactam, aminopropyl-α-caprolactam or aminobutyl-α-caprolactam.

18. A resist material according to claim 14 in which said N-aminoalkyl amide is an N-aminoalkyl linear amide.

19. A resist material according to claim 18 in which said amide is, N-aminoethyl acetamide, or N-aminoethyl propionamide.

20. A resist material according to claim 13 in which said terminally unsaturated alcohol is hydroxyethyl acrylate, hydroxyethyl methacrylate, 3-hydroxypropyl acrylate, 3-hydroxypropylmethacrylate, 4-hydroxybutyl acrylate or 4-hydroxybutyl methacrylate.

21. A resist material according to claim 13 in which said aminoalkyl amide and terminally unsaturated alcohol reaction products are present in a molar ratio of about 40:60 to 60:40 to one another in said mixture.

22. A resist material according to claim 13 in which said aminoalkyl amide and terminally unsaturated alcohol reaction products are present in a molar ratio of about 10:90 to 90:10 to one another in said mixture.

23. A resist material according to claim 13 in which said aminoalkyl amide and terminally unsaturated alcohol reaction products are present in a molar ratio of about 50:50 to one another in said mixture.

24. A resist material according to claim 2 in which the alkyl group of said alkylvinyl ether-maleic anhydride copolymer is a long chain alkyl group.

25. A resist material according to claim 24 in which said alkyl group has about 10-20 carbon atoms.

26. A resist material according to claim 24 in which said alkyl group is octadecyl.

* * * * *